US006996009B2

(12) United States Patent
Forbes

(10) Patent No.: US 6,996,009 B2
(45) Date of Patent: Feb. 7, 2006

(54) NOR FLASH MEMORY CELL WITH HIGH STORAGE DENSITY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 10/177,483

(22) Filed: Jun. 21, 2002

(65) Prior Publication Data

US 2003/0235079 A1 Dec. 25, 2003

(51) Int. Cl.
*G11C 16/04* (2006.01)

(52) U.S. Cl. ............................ 365/185.17; 365/185.28; 365/185.33

(58) Field of Classification Search ............ 365/185.17, 365/185.28, 185.33
See application file for complete search history.

(56) References Cited

U.S. PATENT DOCUMENTS

| | | | |
|---|---|---|---|
| 3,641,516 A | 2/1972 | Casrucci et al. | 365/96 |
| 3,665,423 A | 5/1972 | Nakamuma et al. | 340/173 R |
| 3,877,054 A | 4/1975 | Boulin et al. | 357/23 |

(Continued)

FOREIGN PATENT DOCUMENTS

| | | |
|---|---|---|
| JP | 03-222367 | 10/1991 |
| JP | 06-224431 | 8/1994 |
| JP | 06-302828 | 10/1994 |
| JP | 08-255878 | 10/1996 |
| WO | WO-9907000 A2 | 2/1999 |

OTHER PUBLICATIONS

Aarik, Jaan , et al., "Phase transformations in hafnium dioxide thin films grown by atomic layer depositlon at high temperatures", *Applied Surface Science, 173(1–2)*, (Mar. 2001),15–21.

Abbas, S. A., et al., "N–Channel Igfet Design Limitations Due to Hot Electron Trapping", *Technical Digest, International Electron Devices Meeting,*, Washington, DC,(Dec. 1975),35–38.

Adelmann, C , et al., "Atomic–layer epitaxy of GaN quantum wells and quantum dots on (0001) AlN", *Journal of Applied Physics, 91(8)*, (Apr. 15, 2002),5498–5500.

Ahn, Seong–Deok , et al., "Surface Morphology Improvement of Metalorganic Chemical Vapor Deposition Al Films by Layered Deposition of Al and Ultrathin TiN", *Japanese Journal of Applied Physics, Part 1 (Regular Papers, Short Notes & Review Papers), 39(6A)*, (Jun. 2000),3349–3354.

(Continued)

*Primary Examiner*—Richard Elms
*Assistant Examiner*—Tuan T. Nguyen
(74) *Attorney, Agent, or Firm*—Schwegman, Lundberg, Woessner & Kluth, P.A.

(57) ABSTRACT

Structures and methods for NOR flash memory cells, arrays and systems are provided. The NOR flash memory cell includes a vertical floating gate transistor extending outwardly from a substrate. The floating gate transistor having a first source/drain region, a second source/drain region, a channel region between the first and the second source/drain regions, a floating gate separated from the channel region by a gate insulator, and a control gate separated from the floating gate by a gate dielectric. A sourceline is formed in a trench adjacent to the vertical floating gate transistor and coupled to the first source/drain region. A transmission line coupled to the second source/drain region. And, a wordline is coupled to the control gate perpendicular to the sourceline.

30 Claims, 10 Drawing Sheets

U.S. PATENT DOCUMENTS 3,964,085 A 6/1976 Kahng et al. ............... 428/428
4,152,627 A 5/1979 Priel et al. .................. 315/227
4,217,601 A 8/1980 DeKeersmaecker et al. .. 357/54
4,507,673 A 3/1985 Aoyama et al. .......... 357/23 R
4,661,833 A 4/1987 Mizutani ............... 365/185.01
4,888,733 A 12/1989 Mobley ...................... 365/145
4,939,559 A 7/1990 DiMaria et al. ........... 357/23.5
5,021,999 A 6/1991 Kohda et al. ............... 365/168
5,027,171 A 6/1991 Reedy et al. ............. 357/23.5
5,042,011 A 8/1991 Casper et al. ............... 365/205
5,111,430 A 5/1992 Morie ........................ 365/185
5,253,196 A 10/1993 Shimabukuro et al. ....... 365/45
5,280,205 A 1/1994 Green et al. ................ 307/530
5,293,560 A 3/1994 Harari ........................ 365/185
5,298,447 A 3/1994 Hong .......................... 437/43
5,317,535 A 5/1994 Talreja et al. ............... 365/185
5,388,069 A 2/1995 Kokubo ...................... 365/185
5,399,516 A 3/1995 Bergendahl et al. .......... 437/43
5,410,504 A 4/1995 Ward .......................... 365/149
5,424,993 A 6/1995 Lee et al. ................... 365/218
5,430,670 A 7/1995 Rosenthal .................... 365/45
5,434,815 A 7/1995 Smarandoiu et al. .. 365/189.01
5,438,544 A 8/1995 Makino ...................... 365/185
5,449,941 A 9/1995 Yamazaki et al. .......... 257/411
5,457,649 A 10/1995 Eichman et al. ............ 365/174
5,467,306 A 11/1995 Kaya et al. ............. 365/185.2
5,477,485 A 12/1995 Bergemont et al. .... 365/185.24
5,485,422 A 1/1996 Bauer et al. ................ 365/168
5,493,140 A 2/1996 Iguchi ........................ 257/316
5,508,543 A 4/1996 Hartstein et al. ........... 257/314
5,530,581 A 6/1996 Cogan ........................ 359/265
5,530,668 A 6/1996 Chern et al. ................ 365/145
5,539,279 A 7/1996 Takeuchi et al. ............ 365/145
5,541,871 A 7/1996 Nishimura et al. ......... 365/145
5,541,872 A 7/1996 Lowrey et al. ............. 365/145
5,550,770 A 8/1996 Kuroda ....................... 365/145
5,572,459 A 11/1996 Wilson et al. .............. 365/145
5,600,587 A 2/1997 Koike ........................ 365/145
5,627,781 A 5/1997 Hayashi et al. .......... 365/185.2
5,627,785 A 5/1997 Gilliam et al. ......... 365/189.01
5,670,790 A 9/1997 Katoh et al. .................. 257/14
5,714,766 A 2/1998 Chen et al. ................... 257/20
5,740,104 A 4/1998 Forbes .................. 365/185.03
5,754,477 A 5/1998 Forbes .................. 365/185.33
5,768,192 A 6/1998 Eitan ..................... 365/185.24
5,801,401 A 9/1998 Forbes ........................ 257/77
5,828,605 A 10/1998 Peng et al. ............ 365/185.29
5,852,306 A 12/1998 Forbes ....................... 257/315
5,856,688 A 1/1999 Lee et al. ................... 257/295
5,886,368 A 3/1999 Forbes et al. ................. 257/77
5,912,488 A * 6/1999 Kim et al. ................... 257/316
5,916,365 A 6/1999 Sherman ...................... 117/92
5,936,274 A 8/1999 Forbes et al. ............... 257/315
5,943,262 A * 8/1999 Choi ..................... 365/185.17
5,959,896 A 9/1999 Forbes .................. 365/185.33
5,973,356 A 10/1999 Noble et al. ................ 257/319
5,989,958 A 11/1999 Forbes ....................... 438/257
5,991,225 A 11/1999 Forbes et al. .......... 365/230.06
6,031,263 A 2/2000 Forbes et al. ............... 257/315
6,034,882 A 3/2000 Johnson et al. ............. 365/103
6,072,209 A 6/2000 Noble et al. ................ 257/296
6,115,281 A 9/2000 Aggarwal et al. .......... 365/145
6,124,729 A 9/2000 Noble et al. .................. 326/41
6,125,062 A 9/2000 Ahn et al. ............. 365/198.07
6,140,181 A 10/2000 Forbes et al. ............... 438/257
6,141,237 A 10/2000 Eliason et al. .............. 365/145
6,141,238 A 10/2000 Forbes et al. ............... 365/145
6,141,260 A 10/2000 Ahn et al. ............. 365/189.07
6,143,636 A 11/2000 Forbes et al. ............... 438/587
6,150,687 A 11/2000 Noble et al. ................ 257/302
6,153,468 A 11/2000 Forbes et al. ............... 438/257
6,166,401 A 12/2000 Forbes ........................ 257/77
6,185,122 B1 2/2001 Johnson et al. ............. 365/103
6,212,103 B1 4/2001 Ahrens et al. ......... 365/185.29
6,232,643 B1 5/2001 Forbes et al. ............... 257/405
6,238,976 B1 5/2001 Noble et al. ................ 438/259
6,243,300 B1 6/2001 Sunkavalli ............. 365/185.29
6,246,606 B1 6/2001 Forbes et al. .......... 365/185.03
6,249,020 B1 6/2001 Forbes et al. ............... 257/315
6,252,793 B1 6/2001 Allen et al. ................. 365/145
6,269,023 B1 7/2001 Derhacobian et al. . 365/185.24
6,294,813 B1 9/2001 Forbes et al. ............... 257/321
6,313,518 B1 11/2001 Ahn et al. .................. 257/632
6,337,805 B1 1/2002 Forbes et al. ............... 365/145
6,351,411 B2 2/2002 Forbes et al. ............... 365/182
6,407,435 B1 6/2002 Ma et al. .................... 257/411
6,438,031 B1 8/2002 Fastow .................. 365/185.18
6,445,030 B1 9/2002 Wu et al. ................... 257/315
6,449,188 B1 * 9/2002 Fastow .................. 365/185.18
6,456,531 B1 9/2002 Wang et al. ........... 365/185.18
6,456,536 B1 9/2002 Sobek et al. ........... 365/185.28
6,459,618 B1 10/2002 Wang .................... 365/185.18
6,487,121 B1 11/2002 Thurgate et al. ....... 365/185.18
6,498,362 B1 12/2002 Forbes et al. ............... 257/295
6,504,755 B1 1/2003 Katayama et al. ..... 365/185.15
6,514,828 B2 2/2003 Ahn et al. .................. 438/297
6,521,911 B2 2/2003 Parsons et al. ............... 257/52
6,521,950 B1 2/2003 Shimabukuro et al. ..... 257/350
6,521,958 B1 2/2003 Forbes et al. ............... 257/391
6,545,314 B2 4/2003 Forbes et al.
6,552,387 B1 4/2003 Eitan .......................... 257/324
6,559,014 B1 5/2003 Jeon ........................... 438/287
6,567,303 B1 5/2003 Hamilton et al. ...... 365/185.03
6,567,312 B1 5/2003 Torii et al. ............. 365/185.28
6,570,787 B1 * 5/2003 Wang et al. ........... 365/185.17
6,580,124 B1 6/2003 Cleeves et al. ............. 257/331
6,586,785 B2 7/2003 Flagan et al. ............... 257/261
2002/0003252 A1 1/2002 Iyer ........................... 257/315
2002/0027264 A1 3/2002 Forbes et al. ............... 257/662
2002/0036939 A1 3/2002 Tsai et al. .................. 365/201
2002/0074565 A1 6/2002 Flagan et al. ............... 257/200
2002/0109158 A1 8/2002 Forbes et al. ............... 257/224

OTHER PUBLICATIONS

Akasaki, I. , "Effects of AlN Buffer Layer on Crystallographic Structure and on Electrical and Optical Properties of GaN and Ga(1−x)Al(x)N [0<x (<or =) 0.4] Films Grown on Sapphire Substrate by MOVPE", *Journal of Crystal Growth, 98*, (1989),209–219.

Alen, Petra , et al., "Atomic Layer Deposition of Ta(Al)N(C) Thin Films Using Trimethylaluminum as a Reducing Agent", *Journal of the Electrochemical Society, 148(10)*, (Oct. 2001),G566–G571.

Asari, K , et al., "Multi–mode and multi–level technologies for FeRAM embedded reconfigurable hardware", *Solid–State Circuits Conference, 1999. Digest of Technical Papers. ISSCC. 1999 IEEE International*, (Feb. 15–17, 1999),106–107.

Benjamin, M. , "UV Photoemission Study of Heteroepitaxial AlGaN Films Grown on 6H–SiC", *Applied Surface Science, 104/105*, (Sep. 1996),455–460.

Bermudez, V. , "The Growth and Properties of Al and AlN Films on GaN(0001)–(1×1)", *Journal of Applied Physics, 79(1)*, (Jan. 1996),110–119.

Britton, J , et al., "Metal–nitride–oxide IC memory retains data for meter reader", *Electronics, 45(22)*, (Oct. 23, 1972), 119–23.

Carter, R J., "Electrical Characterization of High–k Materials Prepared By Atomic Layer CVD", *IWGI*, (2001), 94–99.

Chae, Junghun , et al., "Atomic Layer Deposition of Nickel by the Reduction of Preformed Nickel Oxide", *Electrochemical & Solid–State Letters, 5(6)*, (Jun. 2002),C64–C66.

Chaitsak, Suticai ,et al., "Cu(InGa)Se/sub 2/ thin–film solar cells with high resistivity ZnO buffer layers deposited by atomic layer deposition", *Japanese Journal of Applied Physics Part 1–Regular Papers Short Notes & Review Papers, 38(9A)*, (Sep. 1999),4989–4992.

Chang, C. , "Novel Passivation Dielectrics—The Boron– or Phosphorus–Doped Hydrogenated Amorphous Silicon Carbide Films", *Journal of the Electrochemical Society, 132*, (Feb. 1985),418–422.

Cricchi, J R., et al., "Hardened MNOS/SOS electrically reprogrammable nonvolatile memory", *IEEE Transactions on Nuclear Science, 24(6)*, (Dec. 1977),2185–9.

Demichelis, F. , "Influence of Doping on the Structural and Optoelectronic Properties of Amorphous and Microcrystalline Silicon Carbide", *Journal of Applied Physics, 72*, (Aug. 15, 1992),1327–1333.

Demichelis, F. , "Physical Properties of Undoped and Doped Microcrystalline SiC:H Deposited By PECVD", *Materials Research Society Symposium Proceedings, 219*, Anaheim, CA,(Apr. 30–May 3, 1991),413–418.

Desu, S B., "Minimization of Fatigue in Ferroelectric Films", *Physica Status Solidi A, 151(2)*, (1995),467–480.

Dimaria, D J., "Graded or stepped energy band–gap–insulator MIS structures (GI–MIS or SI–MIS)", *Journal of Applied Physics, 50(9)*, (Sep. 1979),5826–5829.

Dipert, Brian, "Flash Memory Goes Mainstream", *IEEE Spectrum, 30(10)*, (Oct. 1993),48–52.

Eitan, Boaz , "NROM: A Novel Localized Trapping, 2–Bit Nonvolatile Memory Cell", *IEEE Electron Device Letters, 21(11)*, (Nov. 2000),543–545.

Elam, J W., "Kinetics of the WF6 and Si2H6 surface reactions during tungsten atomic layer deposition", *Surface Science, 479(1–3)*, (May 2001),121–135.

Fauchet, P M., et al., "Optoelectronics and photovoltaic applications of microcrystalline SiC", *Symp. on Materials Issues in Mecrocrystalline Semiconductors*, (1989),291–292.

Ferris–Prabhu, A V., "Amnesia in layered insulator FET memory devices", *1973 International Electron Devices Meeting Technical Digest*, (1973),75–77.

Ferris–Prabhu, A V., "Charge transfer in layered insulators", *Solid–State Electronics, 16(9)*, (Sep. 1973),1086–7.

Ferris–Prabhu, A V., "Tunnelling theories of non–volatile semiconductor memories", *Physica Status Solidi A, 35(1)*, (May 16, 1976),243–50.

Fisch, D E., et al., "Analysis of thin film ferroelectric aging", *Proc. IEEE Int. Reliability Physics Symp.*, (1990),237–242.

Forbes, L. , et al., "Field Induced Re–Emission of Electrons Trapped in SiO", *IEEE Transactions on Electron Devices, ED–26 (11)*, Briefs,(Nov. 1979),1816–1818.

Forsgren, Katarina, "Atomic Layer Deposition of HfO2 using hafnium iodide", *Conference held in Monterey, California*, (May 2001), 1 page.

Frohman–Bentchkowky, D , "An integrated metal–nitride–oxide–silicon (MNOS) memory", *Proceedings of the IEEE, 57(6)*, (Jun. 1969),1190–1192.

Goodwins, Rupert , "New Memory Technologies on the Way", http://zdnet.com.com/2100–1103–846950.html, (Feb. 2002).

Hwang, C G., "Semiconductor Memories for the IT Era", *2002 IEEE International Solid–State Circuits Conference. Digest of Technical Papers IEEE. Part vol. 1*, San Francisco, (2002),24–27.

Hwang, N. , et al., "Tunneling and Thermal Emission of Electrons from a Distribution of Deep Traps in SiO", *IEEE Transactions on Electron Devices, 40(6)*, (Jun. 1993),1100–1103.

Iddles, D M., et al., "Relationships between dopants, microstructure and the microwave dielectric properties of ZrO2–TiO2–SnO2 ceramics", *Journal of Materials Science, 27(23)*, (Dec. 1992),6303–6310.

Juppo, Marika , et al., "Use of 1,1Dimethylhydrazine in the Atomic Layer Deposition of Transition Metal Nitride Thin Films", *Journal of the Electrochemical Society, 147(9)*, (Sep. 2000),3377–3381.

Kim, Y , et al., "Substrate dependence on the optical properties of Al/sub 2/O/sub 3/ films grown by atomic layer deposition", *Applied Physics Letters, 71(25, 22 )*, (Dec. 1997),3604–3606.

Klaus, J W., et al., "Atomic layer deposition of tungsten nitride films using sequential surface reactions", *Journal of the Electrochemical Society, 147(3)*, (Mar. 2000),1175–81.

Koo, J , "Study on the characteristics of TiAlN thin film deposited by atomic layer deposition method", *Journal of Vacuum Science & Technology A–Vacuum Surfaces & Films, 19(6)*, (Nov. 2001),2831–4.

Kukli, K , et al., "Tailoring the dielectric properties of HfO2–Ta2O3 nanolaminates", *Appl. Phys. Lett., 68*, (1996), 3737–3739.

Lee, L P., et al., "Monolithic 77 K dc SQUID magnetometer", *Applied Physics Letters, 59(23)*, (Dec. 1991),3051–3053.

Lei, T. , "Epitaxial Growth and Characterization of Zinc–Blende Gallium Nitride on (001) Silicon", *Journal of Applied Physics, 71(10)*, (May 1992),4933–4943.

Luan, H. , "High Quality Ta2O5 Gate Dielectrics with Tox,eq<10A", *IEDM*, (1999),pp. 141–144.

Lusky, Eli, et al., "Characterization of channel hot electron injection by the subthreshold slope of NROM/sup TM/ device", *IEEE Electron Device Letters*, 22(11). (Nov. 2001), 556–558

Maayan, Eduardo , et al., "A 512Mb NROM Flash Data Storage Memory with 8MB/s Data Rate", *Solid–State Circuits Conference, 2002. Digest of Technical Papers. ISSCC*, (2002),100–101.

Marlid, Bjorn , et al., "Atomic layer deposition of BN thin films", *Thin Solid Films, 402(1–2)*, (Jan. 2002),167–171.

Martins, R , "Transport Properties of Doped Silicon Oxycarbide Microcrystalline Films Produced by Spatial Separation Techniques", *Solar Energy Materials and Solar Cells, 41–42*, (1996),493–517.

Martins, R. , "Wide Band Gap Microcrystalline Silicon Thin Films", *Diffusion and Defect Data : Solid State Phenomena, 44–46, Part 1*, Scitec Publications,(1995),299–346.

Min, Jae–Sik , et al., "Atomic layer deposition of TiN films by alternate supply of tetrakis (ethylmethylamino)–titanium and ammonia", *Japanese Journal of Applied Physics Part 1–Regular Papers Short Notes & Review Papers*, vol. 37, No. 9A, (Sep. 1998),4999–5004.

Min, J. , "Metal–organic atomic–layer deposition of titanium–silicon–nitride films", *Applied Physics Letters, 75*(*11*), (1999), 1521–1523.
Moazzami, R , "Endurance properties of Ferroelectric PZT thin films", *Int. Electron Devices Mtg.*, San Francisco, (1990),417–20.
Moazzami, R , "Ferroelectric PZT thin films for semiconductor memory", *Ph.D Thesis, University of California, Berkeley*, (1991).
Molnar, R. , "Growth of Gallium Nitride by Electron–Cyclotron Resonance Plasma–Assisted Molecular–Beam Epitaxy: The Role of Charged Species", *Journal of Applied Physics, 76*(*8*), (Oct. 1994),4587–4595.
Morishita, S , "Atomic–layer chemical–vapor–deposition of SiO/sub 2/ by cyclic exposures of CH/sub 3/OSi(NCO)/sub 3/ and H/sub 2/O/sub 2/", *Japanese Journal of Applied Physics Part 1–Regular Papers Short Notes & Review Papers*, vol. 34, No. 10, (Oct. 1995),5738–42.
Moriwaki, M , "Improved metal gate process by simultaneous gate–oxide nitridation during W/WN/sub x/gate formation", *Japanese Journal of Applied Physics Part 1–Regular Papers Short Notes & Review Papers, 39*(*4B*), (Apr. 2000),2177–2180.
Nakajima, Anri , "Soft breakdown free atomic–layer–deposited silicon–nitride/SiO/sub 2/ stack gate dielectrics", *International Electron Devices Meeting. Technical Digest*, (2001),6.5.1–4.
Niilisk, A , "Atomic–scale optical monitoring of the initial growth of TiO2 thin films", *Proceedings of the SPIE—The International Society for Optical Engineering, 4318*, (2001), 72–77.
Pankove, J. , "Photoemission from GaN", *Applied Physics Letters, 25*, (1974),53–55.
Papadas, C. , "Modeling of the Intrinsic Retention Charcteristics of FLOTOX EEPROM Cells Under Elevated Temperature Conditions", *IEEE Transaction on Electron Devices, 42*, (Apr. 1995),678–682.
Park, Jin–Seong , et al., "Plasma–Enhanced Atomic Layer Deposition of Tantalum Nitrides Using Hydrogen Radicals as a Reducing Agent", *Electrochemical & Solid–State Letters, 4*(*4*), (Apr. 2001),C17–19.
Puurunen, R L., et al., "Growth of aluminum nitride on porous silica by atomic layer chemical vapour deposition", *Applied Surface Science, 165*(*2–3*), (Sep. 12, 2000),193–202.
Renlund, G. M., "Silicon oxycarbide glasses: Part I. Preparation and chemistry", *J. Mater. Res.*, (Dec., 1991),pp. 2716–2722.
Robertson, J. , "Band offsets of wide–band–gap oxides and implications for future electronic devices", *Journal of Vacuum Science & Technology B* (*Microelectronics and Nanometer Structures*), *18*(*3*), (May–Jun. 2000),1785–1791.
Sanders, B W., et al., "Zinc Oxysulfide Thin Films Grown by Atomic Layer Deposition", *Chemistry of Materials, 4*(*5*), (1992),1005–1011.
She, Min , et al., "Modeling and design study of nanocrystal memory devices", *IEEE Device Research Conference*, (2001),139–40.
Shimada, H , et al., "Tantalum nitride metal gate FD–SOI CMOS FETs using low resistivity self–grown bcc–tantalum layer", *IEEE Transactions on Electron Devices*, vol. 48, No. 8, (Aug. 200),1619–1626.
Shin, Chang H., et al., "Fabriation and Characterization of MFISFET Using Al2O3 Insulating Layer for Non–volatile Memory", *12th International Symposium in Integrated Ferroelectrics*, (Mar. 2000),9 pages.
Shirota, R , et al., "A 2.3 mu m/sup 2/ memory cell structure for 16 Mb NAND EEPROMs", *International Electron Devices Meeting 1990. Technical Digest*, San Francisco, (1990),103–106.
Sneh, Ofer , et al., "Thin film atomic layer deposition equipment for semiconductor processing", *Thin Solid Films, 402*(*1–2*), (Jan. 1, 2002),248–261.
Solanki, Raj , et al., "Atomic Layer Deposition of Copper Seed Layers", *Electrochemical & Solid–State Letters, 3*(*10*), (Oct. 2000),479–450.
Sze, S M., "Physics of semiconductor devices", *New York: Wiley*, (1981),504–506.
Wei, L S., et al., "Trapping, emission and generation in MNOS memory devices", *Solid–State Electronics, 17*(*6*), (Jun. 1974),591–8.
White, M H., "Characterization of thin–oxide MNOS memory transistors", *IEEE Transactions on Electron Devices, ED–19*(*12*), (Dec. 1972),1280–1288.
White, M H., "Direct tunneling in metal–nitride–oxide–silicon (MNOS) structures", *Programmme of the 31st physical electronics conference*, (1971),1.
Wilk, G. D., et al., "High–K gate dielectrics: Current status and materials properties considerations", *Journal of Applied Physics, 89*(*10*), (2001),5243–5275.
Wood, S W., "Ferroelectric memory design", *M.A.Sc. thesis, University of Toronto*, (1992).
Yagishita, A , "Dynamic threshold voltage damascene metal gate MOSFET (DT–DMG–MOS) with low threshold voltage, high drive current and uniform electrical characteristics", *International Electron Devices Meeting 2000. Technical Digest. IEDM*, (Dec. 2000), 1633–1636.
YODER, M, "Wide Bandgap Semiconductor Materials and Devices", *IEEE Transactions on Electron Devices, 43*, (Oct. 1996),1633–1636.
Zhu, W J., et al., "Current transport in metal/hafnium oxide/silicon structure", *IEEE Electron Device Letters, 23*, (2002),97–99.
Zhu. W , et al., "HfO2 and HfAlO for CMOS: Thermal Stability and Current Transport", *IEEE International Electron Device Meeting 2001*, (2001),463–466.

* cited by examiner

NOR FLASH MEMORY CELL WITH HIGH STORAGE DENSITY

CROSS REFERENCE TO RELATED APPLICATIONS

This application is related to the following co-pending, commonly assigned U.S. patent applications: "Write Once Read Only Memory Employing Floating Gates," Ser. No. 10/177,083, "Write Once Read Only Memory Employing Charge Trapping in Insulators," Ser. No. 10/177,077, "Ferroelectric Write Once Read Only Memory for Archival Storage," Ser. No. 10/177,082, "Nanocrystal Write Once Read Only Memory for Archival Storage," Ser. No. 10/177,214, "Write Once Read Only Memory with Large Work Function Floating Gates," Ser. No. 10/177,213, "Vertical NROM Having a Storage Density of 1 Bit per 1 $F^2$," Ser. No. 10/177,208, and "Multistate NROM Having a Storage Density Much Greater than 1 Bit per $1F^2$," Ser. No. 10/177,211, each of which disclosure is herein incorporated by reference.

FIELD OF THE INVENTION

The present invention relates generally to semiconductor integrated circuits and, more particularly, to NOR flash memory cells with high storage density.

BACKGROUND OF THE INVENTION

Many electronic products need various amounts of memory to store information, e.g. data. One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell.

Another type of high speed, low cost memory includes floating gate memory cells. A conventional horizontal floating gate transistor structure includes a source region and a drain region separated by a channel region in a horizontal substrate. A floating gate is separated by a thin tunnel gate oxide. The structure is programmed by storing a charge on the floating gate. A control gate is separated from the floating gate by an intergate dielectric. A charge stored on the floating gate effects the conductivity of the cell when a read voltage potential is applied to the control gate. The state of cell can thus be determined by sensing a change in the device conductivity between the programmed and un-programmed states.

With successive generations of DRAM chips, an emphasis continues to be placed on increasing array density and maximizing chip real estate while minimizing the cost of manufacture. It is further desirable to increase array density with little or no modification of the DRAM optimized process flow.

Flash memories based on electron trapping are well known and commonly used electronic components. Recently NAND flash memory cells have become common in applications requiring high storage density while NOR flash memory cells are used in applications requiring high access and read speeds. NAND flash memories have a higher density because 16 or more devices are placed in series, this increases density at the expense of speed.

Thus, there is an ongoing need for improved DRAM technology compatible flash memory cells. It is desirable that such flash memory cells be fabricated on a DRAM chip with little or no modification of the DRAM process flow. It is further desirable that such flash cells provide increased density and high access and read speeds.

REFERENCES

B. Dipert and L. Hebert, "Flash Memory goes Mainstream," IEEE Spectrum, No. 10, pp. 48–52, (October 1993);

R. Goodwins, "New Memory Technologies on the Way," http://zdnet.com.com/2100-1103-846950.html;

C.-G. Hwang, "Semiconductor Memories for the IT Era," Abst. IEEE Int. Solid-State Circuits Conf., San Francisco, 2002, pp. 24–27;

R. Shirota et al., "A 2.3 $mu^2$ memory cell structure for 16 Mb NAND EEPROMs," Digest of IEEE Int. Electron Device Meeting, San Francisco, 1990, pp. 103–106);

L. Forbes, W. P. Noble and E. H. Cloud, "MOSFET Technology for Programmable Address Decode and Correction," U.S. Pat. No. 6,521,950;

L. Forbes and J. Geusic, "Memory Using Insulator Traps," U.S. Pat. No. 6,140,181;

S. Sze, Physics of Semiconductor Devices, Wiley, N.Y., 1981, pp. 504–506;

B. Eitan et al., "Characterization of Channel Hot Electron Injection by the Subthreshold Slope of NROM Device," IEEE Electron Device Lett., Vol. 22, No. 11, pp. 556–558, (November 2001);

B. Etian et al., "NROM: A novel localized Trapping, 2-Bit Nonvolatile Memory Cell," IEEE Electron Device Lett., Vol. 21, No. 11, pp. 543–545, (November 2000);

L. Forbes and K. Ahn, "Flash Memory with Ultrathin Vertical Body Transistors," U.S. Pat. No. 6,424,001.

SUMMARY OF THE INVENTION

The above mentioned problems for creating DRAM technology compatible flash memory cells as well as other problems are addressed by the present invention and will be understood by reading and studying the following specification. This disclosure describes a high speed NOR type flash memory cell and arrays with high density. Two transistors occupy an area of 4 F squared when viewed from above, or each memory cell consisting of one transistor has an area of 2 F squared. NAND flash memories are ideally as small as 4 F squared in conventional planar device technology, with practical devices having a cell area of 5 F squared. The vertical NOR flash memory cells described here have a higher density than conventional planar NAND cells but they would operate at speeds higher than or comparable to conventional planar NOR flash memories. The NOR flash memories described here then have both high density and high speed.

In particular, an embodiment of the present invention includes a NOR flash cell. The NOR flash memory cell includes a floating gate transistor extending outwardly from a substrate. The floating gate transistor has a first source/drain region, a second source/drain region, a channel region between the first and the second source/drain regions, a floating gate separated from the channel region by a gate insulator, and a control gate separated from the floating gate by a gate dielectric. A sourceline is formed buried in a trench adjacent to the vertical floating gate transistor and coupled to the first source/drain region. A transmission line coupled to the second source/drain region. And, a wordline is coupled to the control gate perpendicular to the sourceline.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
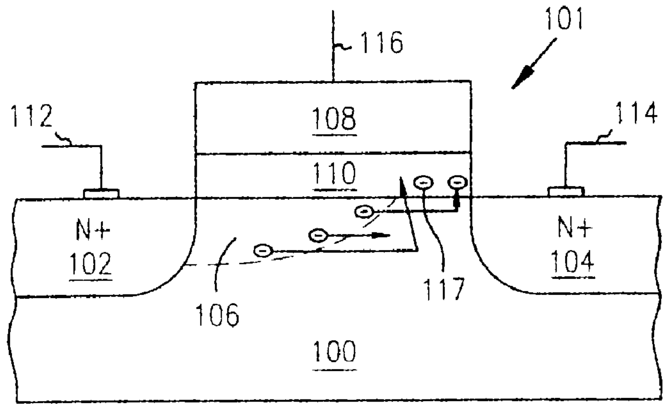
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
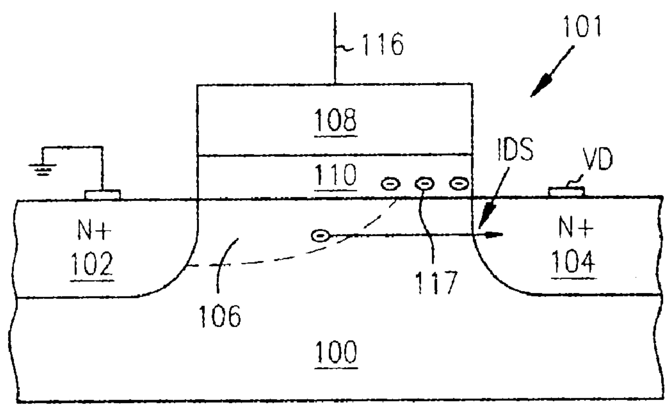
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
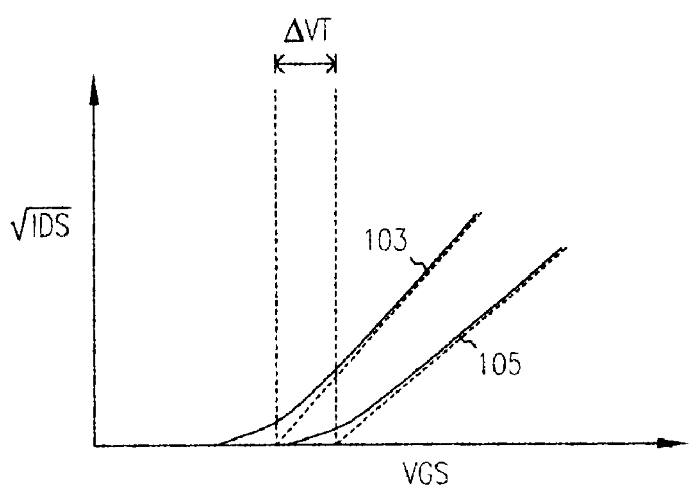
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, ΔVT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 103 represents the charge carrier mobility in the channel 106 for FIG. 1A having no electrons trapped in the gate oxide 110. Slope 105 represents the charge mobility in the channel 106 for the conventional MOSFET of FIG. 1B having electrons 117 trapped in the gate oxide 110 near the drain region 104. As shown by a comparison of slope 103 and slope 105 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventor, along with others, has previously described programmable memory devices and functions based on the reverse stressing of MOSFET's in a conventional CMOS process and technology in order to form programmable address decode and correction in U.S. Pat. No. 6,521,950 entitled "MOSFET Technology for Programmable Address Decode and Correction." That disclosure, however, did not describe write once read only memory solutions, but rather address decode and correction issues. The inventor also describes write once read only memory cells employing charge trapping in gate insulators for conventional MOSFETs and write once read only memory employing floating gates. The same are described in co-pending, commonly assigned U.S. patent applications, entitled "Write Once Read Only Memory Employing Charge Trapping in Insulators," Ser. No. 10/177,077, and "Write Once Read Only Memory Employing Floating Gates," Ser. No. 10/177,083. The present application, however, describes NOR flash cells formed from conventional flash memory device structures.

According to the teachings of the present invention, normal flash memory cells can be programmed by operation in the reverse direction and utilizing avalanche hot electron injection to trap electrons on the floating gate of the floating gate transistor. When the programmed floating gate transistor is subsequently operated in the forward direction the electrons trapped on the floating gate cause the channel to have a different threshold voltage. The novel programmed floating gate transistors of the present invention conduct significantly less current than conventional flash cells which have not been programmed. These electrons will remain trapped on the floating gate unless negative control gate voltages are applied. The electrons will not be removed from the floating gate when positive or zero control gate voltages are applied. Erasure can be accomplished by applying negative control gate voltages and/or increasing the temperature with negative control gate bias applied to cause the trapped electrons on the floating gate to be re-emitted back into the silicon channel of the MOSFET.

Figure 2A:
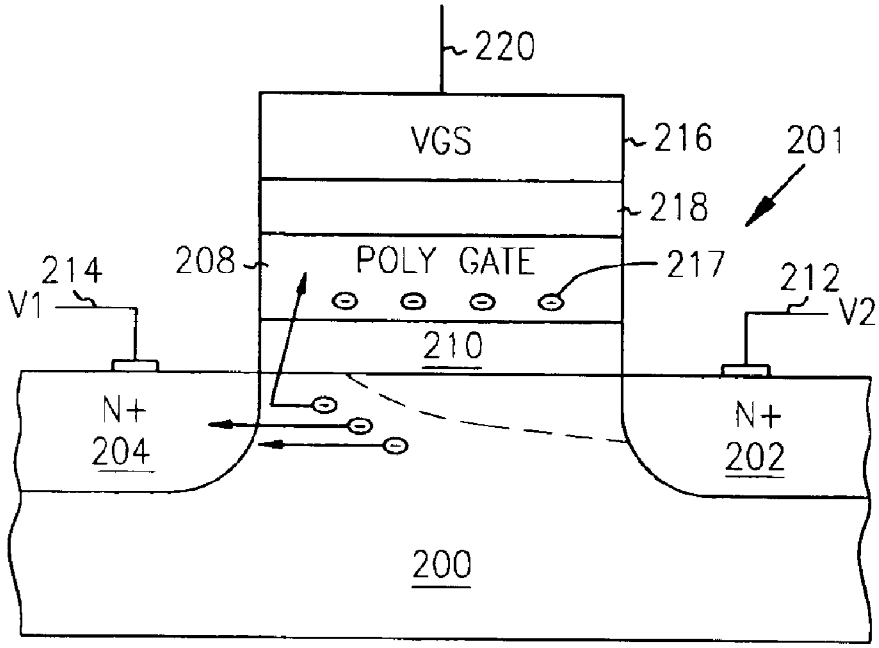
FIG. 2A is a diagram of a programmed MOSFET which can be used as a NOR flash cell according to the teachings of the present invention.

FIG. 2A is a diagram of a programmed floating gate transistor which can be used as a NOR flash cell according to the teachings of the present invention. As shown in FIG. 2A the NOR flash cell 201 includes a floating gate transistor in a substrate 200 which has a first source/drain region 202, a second source/drain region 204, and a channel region 206 between the first and second source/drain regions, 202 and 204. In one embodiment, the first source/drain region 202 includes a source region 202 for the floating gate transistor and the second source/drain region 204 includes a drain region 204 for the floating gate transistor. FIG. 2A further illustrates a floating gate 208 separated from the channel region 206 by a floating gate insulator 210. An array plate 212 is coupled to the first source/drain region 202 and a transmission line 214 is coupled to the second source/drain region 204. In one embodiment, the transmission line 214 includes a bit line 214. Further as shown in FIG. 2A, a control gate 216 is separated from the floating gate 208 by a gate dielectric 218.

As stated above, NOR flash cell 201 is comprised of a programmed floating gate transistor. This programmed floating gate transistor has a charge 217 trapped on the floating gate 208. In one embodiment, the charge 217 trapped on the floating gate 208 includes a trapped electron charge 217.

Figure 2B:
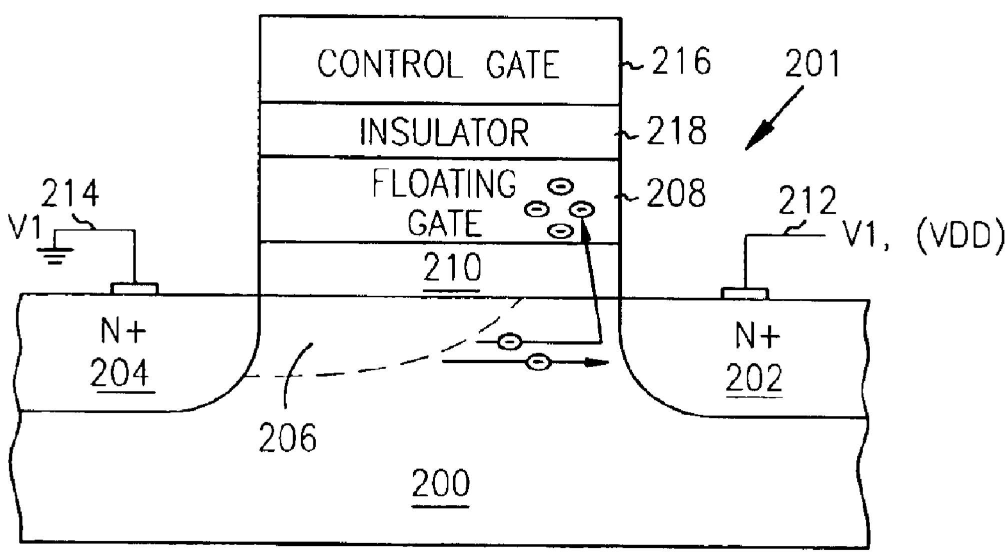
FIG. 2B is a diagram suitable for explaining the method by which the MOSFET of the NOR flash cell of the present invention can be programmed to achieve the embodiments of the present invention.

FIG. 2B is a diagram suitable for explaining the method by which the floating gate of the NOR flash cell 201 of the present invention can be programmed to achieve the embodiments of the present invention. As shown in FIG. 2B the method includes programming the floating gate transistor. Programming the floating gate transistor includes applying a first voltage potential V1 to a drain region 204 of the floating gate transistor and a second voltage potential V2 to the source region 202.

In one embodiment, applying a first voltage potential V1 to the drain region 204 of the floating gate transistor includes grounding the drain region 204 of the floating gate transistor as shown in FIG. 2B. In this embodiment, applying a second voltage potential V2 to the source region 202 includes biasing the array plate 212 to a voltage higher than VDD, as shown in FIG. 2B. A gate potential VGS is applied to the control gate 216 of the floating gate transistor. In one embodiment, the gate potential VGS includes a voltage potential which is less than the second voltage potential V2, but which is sufficient to establish conduction in the channel 206 of the floating gate transistor between the drain region 204 and the source region 202. As shown in FIG. 2B, applying the first, second and gate potentials (V1, V2, and VGS respectively) to the floating gate transistor creates a hot electron injection into the floating gate 208 of the floating gate transistor adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the floating gate 208 adjacent to the source region 202. Here the charge carriers become trapped.

In an alternative embodiment, applying a first voltage potential V1 to the drain region 204 of the floating gate transistor includes biasing the drain region 204 of the floating gate transistor to a voltage higher than VDD. In this embodiment, applying a second voltage potential V2 to the source region 202 includes grounding the array plate 212. A gate potential VGS is applied to the control gate 216 of the floating gate transistor. In one embodiment, the gate potential VGS includes a voltage potential which is less than the first voltage potential V1, but which is sufficient to establish conduction in the channel 206 of the floating gate transistor between the drain region 204 and the source region 202. Applying the first, second and gate potentials (V1, V2, and VGS respectively) to the floating gate transistor creates a hot electron injection into the floating gate 208 of the floating gate transistor adjacent to the drain region 204. In other words, applying the first, second and gate potentials (V1, V2, and VGS respectively) provides enough energy to the charge carriers, e.g. electrons, being conducted across the channel 206 that, once the charge carriers are near the drain region 204, a number of the charge carriers get excited into the floating gate 208 adjacent to the drain region 204. Here the charge carriers become trapped as shown in FIG. 2A.

In one embodiment of the present invention, the method is continued by subsequently operating the floating gate transistor in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the floating gate. That is, a gate potential can be applied to the control gate 216 by a wordline 220 in an effort to form a conduction channel between the source and the drain regions as done with addressing and reading conventional DRAM cells.

However, now in its programmed state, the conduction channel 206 of the floating gate transistor will have a higher voltage threshold and will not conduct.

Figure 2C:
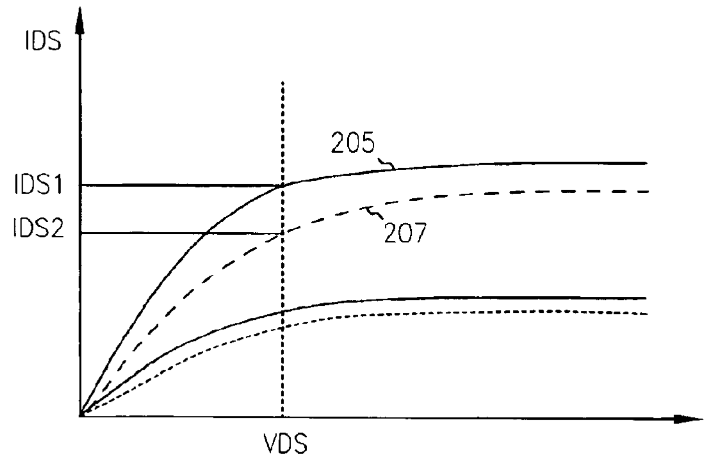
FIG. 2C is a graph plotting the current signal (Ids) detected at the drain region versus a voltage potential, or drain voltage, (VDS) set up between the drain region and the source region (Ids vs. VDS).

FIG. 2C is a graph plotting a current signal (IDS) detected at the second source/drain region 204 versus a voltage potential, or drain voltage, (VDS) set up between the second source/drain region 204 and the first source/drain region 202 (IDS vs. VDS). In one embodiment, VDS represents the voltage potential set up between the drain region 204 and the source region 202. In FIG. 2C, the curve plotted as 205 represents the conduction behavior of a conventional floating gate transistor where the transistor is not programmed (is normal or not stressed) according to the teachings of the present invention. The curve 207 represents the conduction behavior of the programmed floating gate transistor (stressed), described above in connection with FIG. 2A, according to the teachings of the present invention. As shown in FIG. 2C, for a particular drain voltage, VDS, the current signal (IDS2) detected at the second source/drain region 204 for the programmed floating gate transistor (curve 207) is significantly lower than the current signal (IDS1) detected at the second source/drain region 204 for the conventional floating gate cell (curve 205) which is not programmed according to the teachings of the present invention. Again, this is attributed to the fact that the channel 206 in the programmed floating gate transistor of the present invention has a different voltage threshold.

Some of these effects have recently been described for use in a different device structure, called an NROM, for flash memories. This latter work in Israel and Germany is based on employing charge trapping in a silicon nitride layer in a non-conventional flash memory device structure. Charge trapping in silicon nitride gate insulators was the basic mechanism used in MNOS memory devices charge trapping in aluminum oxide gates was the mechanism used in MIOS memory devices and the present inventor, along with another, disclosed charge trapping at isolated point defects in gate insulators in U.S. Pat. No. 6,140,181 entitled "Memory Using Insulator Traps." However, none of the above described references addressed forming NOR flash memory cells.

That is, in contrast to the above work, the present invention discloses programming a floating gate transistor to trap charge and reading the device to form a NOR flash memory cell with high density.

Figure 3:
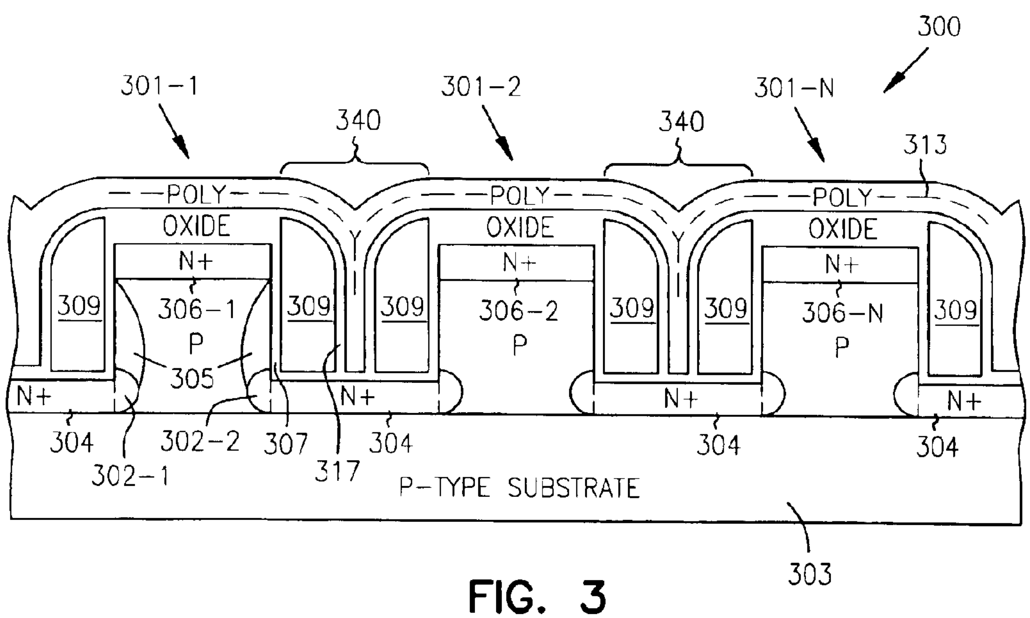
FIG. 3 illustrates a portion of a memory array according to the teachings of the present invention.

FIG. 3 illustrates a portion of a memory array 300 according to the teachings of the present invention. The memory in FIG. 3, is shown illustrating a number of vertical pillars, or NOR flash cells, 301-1, 301-2, . . . , 301-N, formed according to the teachings of the present invention. As one of ordinary skill in the art will appreciate upon reading this disclosure, the number of vertical pillar are formed in rows and columns extending outwardly from a substrate 303. As shown in FIG. 3, the number of vertical pillars, 301-1, 301-2, . . . , 301-N, are separated by a number of trenches 340. According to the teachings of the present invention, the number of vertical pillars, 301-1, 301-2, . . . , 301-N, serve as NOR floating gate transistors including a first source/drain region, e.g. 302-1 and 302-2 respectively. The first source/drain region, 302-1 and 302-2, is coupled to a sourceline 304. As shown in FIG. 3, the sourceline 304 is formed in a bottom of the trenches 340 between rows of the vertical pillars, 301-1, 301-2, . . . , 301-N. According to the teachings of the present invention, the sourceline 304 is formed from a doped region implanted in the bottom of the trenches 340. A second source/drain region, e.g. 306-1 and 306-2 respectively, is coupled to a bitline (not shown). A channel region 305 is located between the first and the second source/drain regions.

As shown in FIG. 3, a floating gate, shown generally as 309, is separated from the channel region 305 by a first gate insulator 307 in the trenches 340 along rows of the vertical pillars, 301-1, 301-2, . . . , 301-N. In one embodiment, according to the teachings of the present invention, the first gate insulator 307 includes a gate insulator 307 selected from the group of silicon dioxide ($SiO_2$) formed by wet oxidation, silicon oxynitride (SON), silicon rich oxide (SRO), and aluminum oxide ($Al_2O_3$). In another embodiment, according to the teachings of the present invention, the gate insulator 307 includes an oxide-nitride-oxide (ONO) gate insulator 307. In the embodiment shown in FIG. 3, a control line 313 is formed across the number of pillars and in the trenches 340 between the floating gates. The control line 313 is separated from the pillars and the floating gates by a second gate insulator 317.

Figure 4:
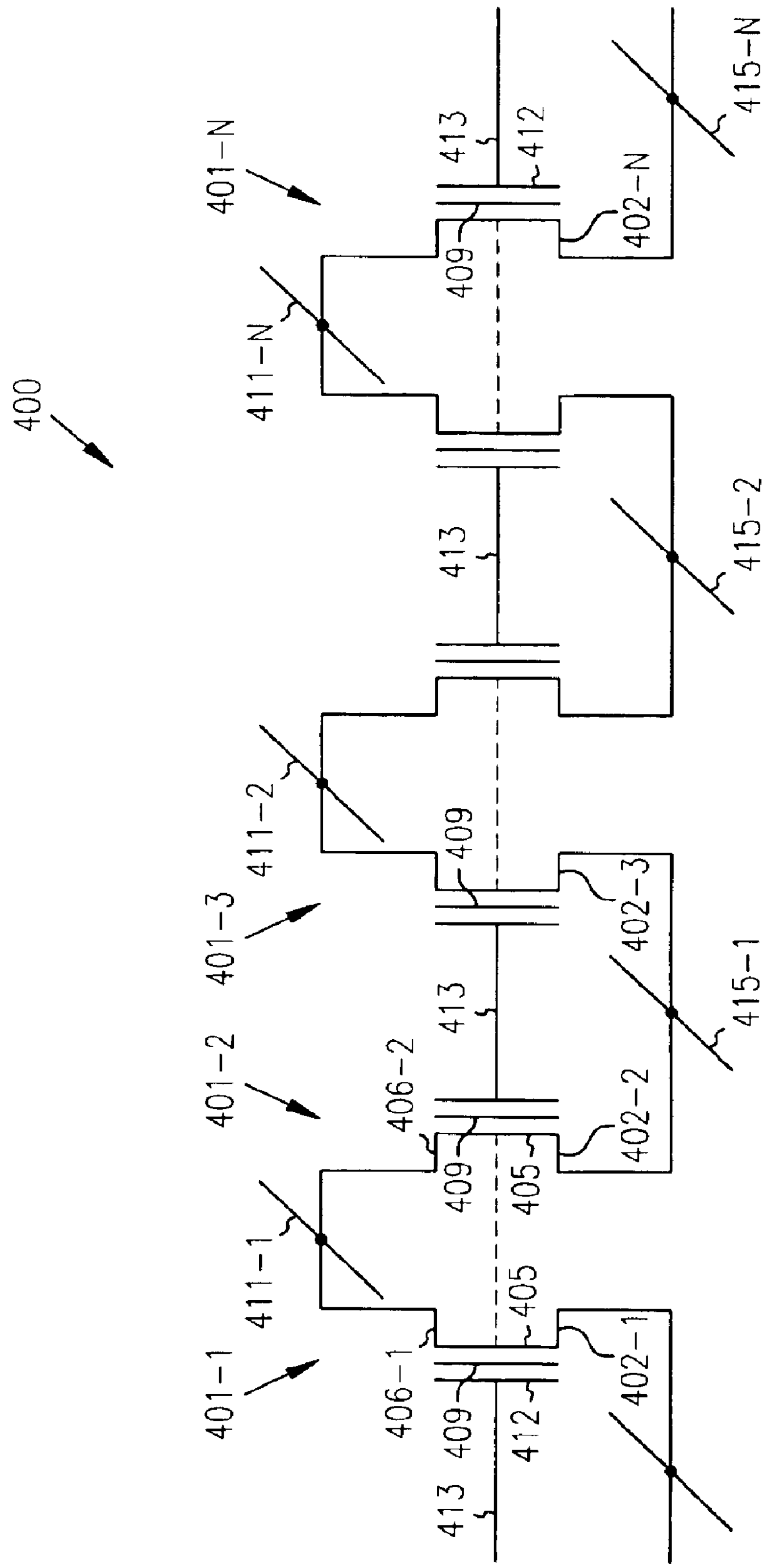
FIG. 4 illustrates an electrical equivalent circuit for the portion of the memory array shown in FIG. 3.

FIG. 4 illustrates an electrical equivalent circuit 400 for the portion of the memory array shown in FIG. 3. As shown in FIG. 4, a number of vertical NOR flash cells, 401-1, 401-2, . . . , 401-N, are provided. Each vertical NOR flash cell, 401-1, 401-2, . . . , 401-N, includes a first source/drain region, e.g. 402-1 and 402-2, a second source/drain region, e.g. 406-1 and 406-2, a channel region 405 between the first and the second source/drain regions, and a floating gate, shown generally as 409, separated from the channel region by a first gate insulator.

FIG. 4 further illustrates a number of bit lines, e.g. 411-1 and 411-2. According to the teachings of the present invention as shown in the embodiment of FIG. 4, a single bit line, e.g. 411-1 is coupled to the second source/drain regions, e.g. 406-1 and 406-2, for a pair of NOR flash cells 401-1 and 401-2 since, as shown in FIG. 3, each pillar contains two NOR flash cells. As shown in FIG. 4, the number of bit lines, 411-1 and 411-2, are coupled to the second source/drain regions, e.g. 406-1 and 406-2, along rows of the memory array. A number of word lines, such as wordline 413 in FIG. 4, are coupled to a control gate 412 of each NOR flash cell along columns of the memory array. According to the teachings of the present invention, a number of sourcelines, 415-1, 415-2, . . . , 415-N, are formed in a bottom of the trenches between rows of the vertical pillars, described in connection with FIG. 3, such that first source/drain regions, e.g. 402-2 and 402-3, in column adjacent NOR flash cells, e.g. 401-2 and 401-3, separated by a trench, share a common sourceline, e.g. 415-1. And additionally, the number of sourcelines, 415-1, 415-2, . . . , 415-N, are shared by column adjacent NOR flash cells, e.g. 401-2 and 401-3, separated by a trench, along rows of the memory array 400. In this manner, by way of example and not by way of limitation referring to column adjacent NOR flash cells, e.g. 401-2 and 401-3, separated by a trench, when one column adjacent NOR flash cell, e.g. 401-2, is being read its complement column adjacent NOR flash cell, e.g. 401-3, can operate as a reference cell.

FIGS. 5A–5E are cross sectional views of various embodiments of the invention from the same vantage point illustrated in FIG. 3. However, FIGS. 5A–5E are intended to illustrate the numerous floating gate and control gate configurations which are intended within the scope of the present invention. For each of the embodiments illustrated in FIGS. 5A–5E, a wordline (not shown for sake of clarity) will couple to the various control gate configurations along columns of an array, and the sourcelines and bitlines will run along rows of the array (here shown running into the plane of the drawing sheet), in the same fashion as wordline 413, sourcelines 415-1, 415-2, . . . , 415-N, and bitlines 411-1, 411-2, . . . , 411-N are arranged in FIG. 4. For each of the embodiments illustrated in FIGS. 5A–5E, a number of vertical pillars, e.g. 500-1 and 500-2, are illustrated with each pillar containing a pair of NOR flash cells. In these embodiments, a single second source/drain region 506 is shared at the top of each pillar. Each of the pillars are separated by rows of trenches 530. A buried sourceline 504 is located at the bottom of each trench 530, e.g. a doped region implanted in the bottom of trenches 530. In these embodiments, a portion of the buried sourceline undercuts the pillars, e.g. 500-1 and 500-2, on opposing sides to serve as the respective first source/drain region for the pair of NOR flash cells. Thus, on each side of a pillar, a conduction channel 505 can be created in the body 507 of the pillar between the second source/drain region 503 and the respective sourcelines in each neighboring trench.

As one of ordinary skill in the art will understand upon reading this disclosure, the NOR flash cells are programmed by grounding the source line and applying a gate voltage and a voltage to the second source/drain region, e.g. drain region. To read this state the drain and ground or source have the normal connections and the conductivity of the transistor determined. The devices can be erased by applying a large negative voltage to the gate and positive voltage to the source. The coincidence and of gate and source bias at the same location can erase a transistor at this location, but the gate bias alone or source bias alone is not sufficient to disturb or erase the charge storage state of other transistors in the array.

Figure 5A:
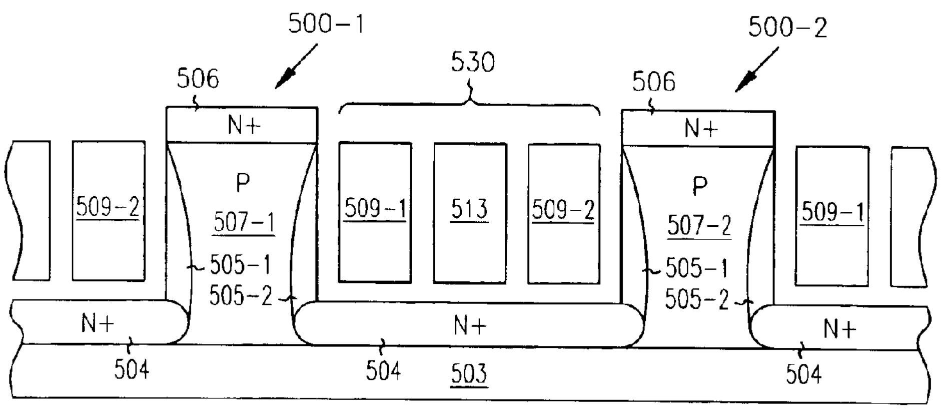
FIGS. 5A–5E are cross sectional views of various embodiments of the invention from the same vantage point illustrated in FIG. 3.

FIG. 5A illustrates one embodiment of the present invention's floating gate and control gate configuration. As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in column adjacent pillars 500-1 and 500-2 on opposing sides of the trench 530.

In the embodiment of FIG. 5A, a single control gate 513 is shared by the pair of floating gates 509-1 and 509-2 on opposing sides of the trench 530. As shown in FIG. 5A, the single control gate 513 is formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
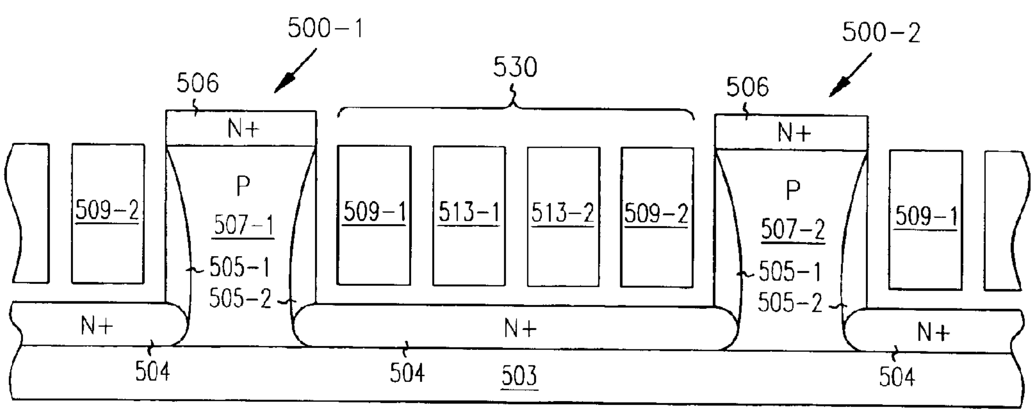

FIG. 5B illustrates another embodiment of the present invention's floating gate and control gate configuration. As shown in the embodiment of FIG. 5B, a pair of floating gates 509-1 and 509-2 are formed in each trench 530 between column adjacent pillars 500-1 and 500-2. Each one of the pair of floating gates, 509-1 and 509-2, respectively opposes the body regions 507-1 and 507-2 in column adjacent pillars 500-1 and 500-2 on opposing sides of the trench 530.

In the embodiment of FIG. 5B, a pair of control gates, shown as 513-1 and 513-2, are formed in trenches, e.g. trench 530, below the top surface of the pillars, 500-1 and 500-2, and between the pair of floating gates 509-1 and 509-2. Each one of the pair of control gates, 513-1 and 513-2, addresses the floating gates, 509-1 and 509-2 respectively, on opposing sides of the trench 530. In this embodiment, the pair of control gates 513-1 and 513-2 are separated by an insulator layer.

Figure 5C:
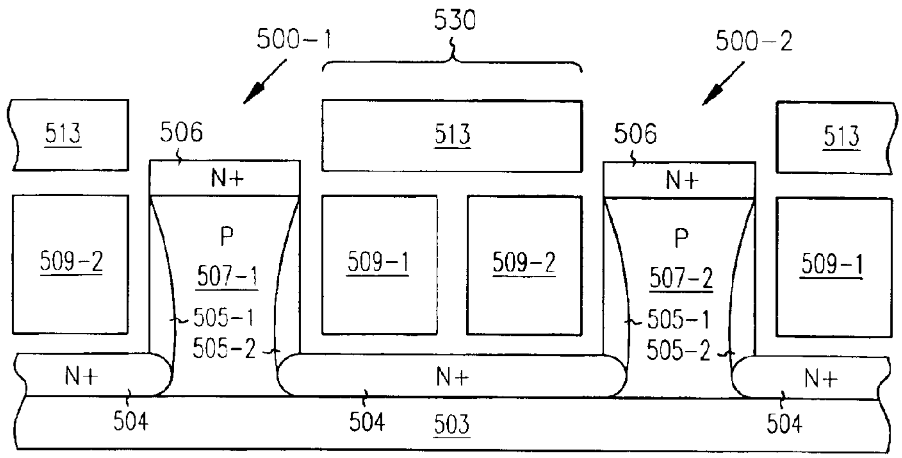

FIG. 5C illustrates another embodiment of the present invention's floating gate and control gate configuration. As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the control gates 513 are disposed vertically above the floating gates. That is, in this embodiment, the control gates 513 are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate 513.

Figure 5D:
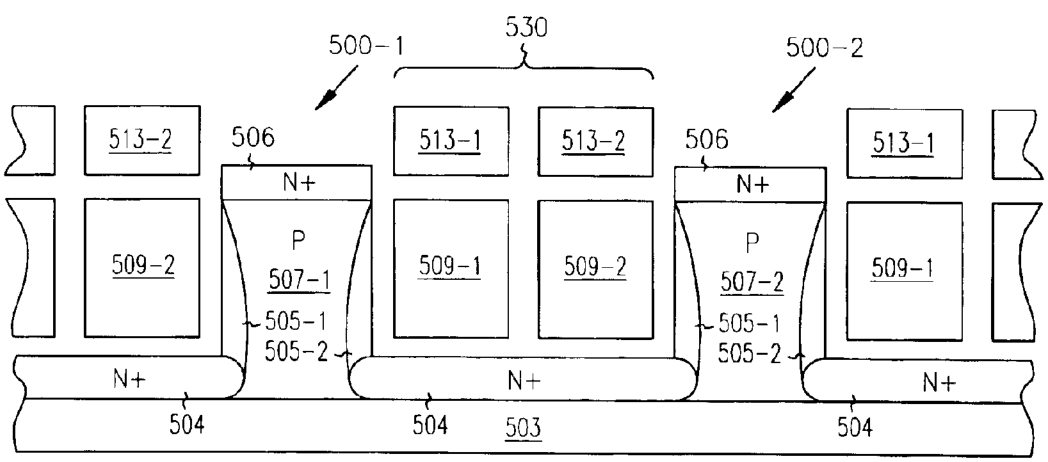

FIG. 5D illustrates another embodiment of the present invention's floating gate and control gate configuration. As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, a pair of individual control gates 513-1 and 513-2 are disposed vertically above each individual one of the pair of floating gates 509-1 and 509-2. That is, the pair of individual control gates 513-1 and 513-2 are located above the pair of floating gates 509-1 and 509-2 and not fully beneath the top surface of the pillars 500-1 and 500-2.

Figure 5E:
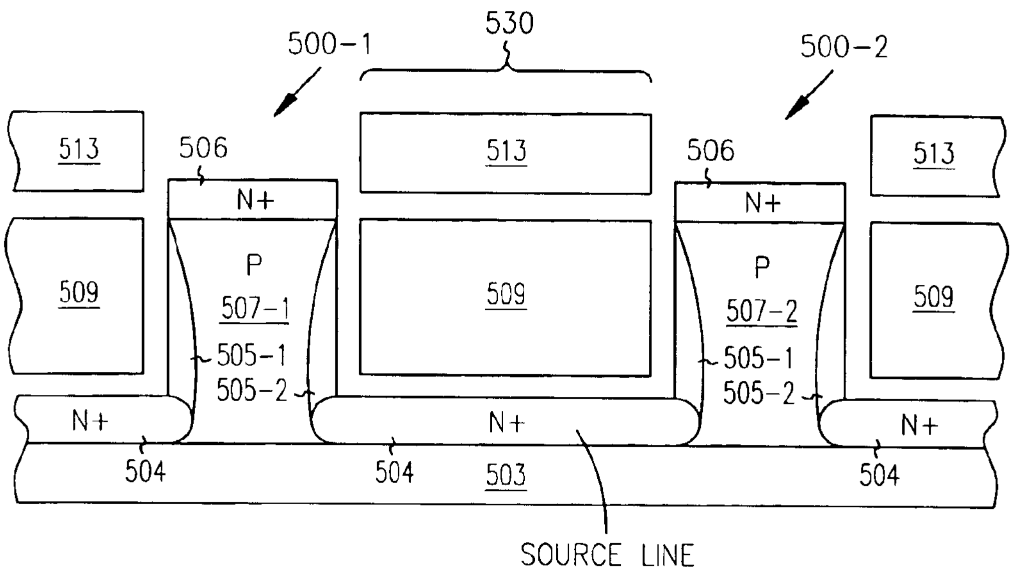

FIG. 5E illustrates another embodiment of the present invention's floating gate and control gate configuration. As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780,169, now U.S. Pat. No. 6,424,001. The same is incorporated herein in full. In one embodiment of the present invention, the floating gate 509 has a vertical length facing the channel regions 505-1 and 505-2 of less than 100 nm. In another embodiment, the floating gate 509 has a vertical length facing the channel regions 505-1 and 505-2 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530.

In the embodiment of FIG. 5E, the control gates 513 are disposed vertically above the floating gates. That is, in this embodiment, the control gates 513 are located above the floating gate 509 and not fully beneath the top surface of the pillars 500-1 and 500-2.

Figure 6A:
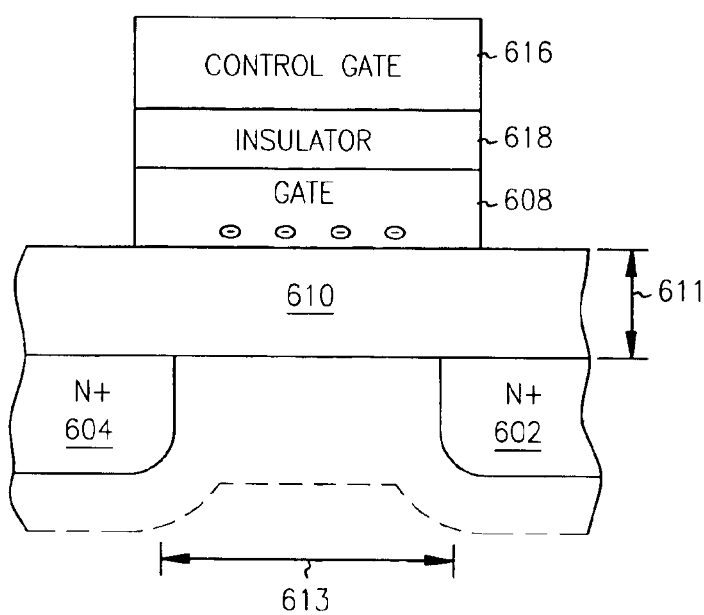
FIGS. 6A–6B illustrates the operation of the novel NOR flash cell formed according to the teachings of the present invention.
Figure 6B:
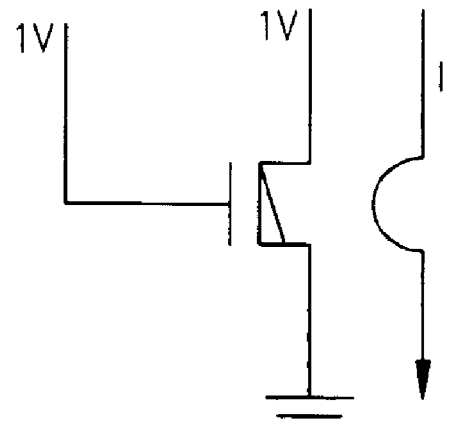
Figure 7:
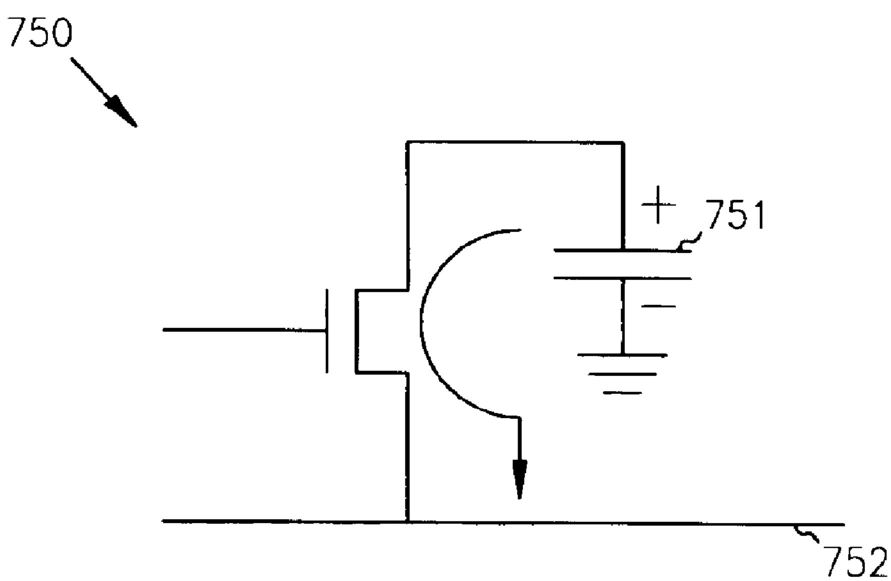
FIG. 7 illustrates the operation of a conventional DRAM cell.

FIGS. 6A–B and 7 are useful in illustrating the use of charge storage in the floating gate to modulate the conductivity of the NOR flash memory cell according to the teachings of the present invention. That is, FIGS. 6A–6B illustrates the operation of the novel NOR flash memory cell 601 formed according to the teachings of the present invention. And, FIG. 7 illustrates the operation of a conventional DRAM cell 501. As shown in FIG. 7, the gate insulator 702 is made thicker than in a conventional DRAM cell. For example, an embodiment of the gate insulator 610 has a thickness 611 equal to or greater than 10 nm or 100 Å ($10^{-6}$ cm). In the embodiment shown in FIG. 7A a NOR flash memory cell has dimensions 613 of 0.1 $\mu$m ($10^{-5}$ cm) by 0.1 $\mu$m. The capacitance, Ci, of the structure depends on the dielectric constant, $\in_i$, and the thickness of the insulating layers, t. In an embodiment, the dielectric constant is $0.3\times10^{-12}$ F/cm and the thickness of the insulating layer is $10^{-6}$ cm such that Ci=∈i/t, Farads/cm$^2$ or $3\times10^{-7}$ F/cm$^2$. In one embodiment, a charge of $10^{12}$ electron/cm$^2$ is programmed into the floating gate of the NOR flash memory cell. This produces a stored charge Δ Q=$10^{12}$ electrons/cm$^2\times1.6\times10^{-19}$ Coulombs. In this embodiment, the resulting change in the threshold voltage (Δ Vt) of the NOR flash memory cell will be approximately 0.5 Volts (Δ Vt=Δ Q/Ci or $1.6\times10^{-7}/3\times10^{-7}$=½ Volt). For Δ Q=$10^{12}$ electrons/cm$^3$ in an area of $10^{-10}$ cm$^2$, this embodiment of the present invention involves trapping a charge of approximately 100 electrons in the floating gate of the NOR flash memory cell. In this embodiment, an original $V_T$ is approximately ½ Volt and the $V_T$ with charge trapping is approximately 1 Volt.

FIG. 6B aids to further illustrate the conduction behavior of the novel NOR flash memory cell of the present invention. As one of ordinary skill in the art will understand upon reading this disclosure, if the NOR flash memory cell is being driven with a control gate voltage of 1.0 Volt (V) and the nominal threshold voltage without the floating gate charged is ½ V, then if the floating gate is charged the floating gate transistor of the present invention will be off and not conduct. That is, by trapping a charge of approximately 100 electrons in the floating gate of the NOR flash memory cell, having dimensions of 0.1 $\mu$m ($10^{-5}$ cm) by 0.1 $\mu$m, will raise the threshold voltage of the NOR flash memory cell to 1.0 Volt and a 1.0 Volt control gate potential will not be sufficient to turn the device on, e.g. Vt=1.0 V, I=0.

Conversely, if the nominal threshold voltage without the floating gate charged is ½ V, then $I=\mu C_{ox}\times(W/L)\times((Vgs-Vt)^2/2)$, or 12.5 $\mu$A, with $\mu C_{ox}=\mu C_i=100\ \mu A/V^2$ and W/L=1. That is, the NOR flash memory cell of the present invention, having the dimensions describe above will produce a current $I=100\ \mu A/V^2\times(1/4)\times(1/2)=12.5\ \mu A$. Thus, in the present invention an un-written, or un-programmed NOR flash memory cell can conduct a current of the order 12.5 $\mu$A, whereas if the floating gate is charged then the NOR flash memory cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM cell 750 with 30 femtoFarad (fF) storage capacitor 751 charged to 50 femto Coulombs (fC), if these are read over 5 nS then the average current on a bit line 752 is only 10 $\mu$A (I=50 fC/5 ns=10 $\mu$A). Thus, storing a 50 fC charge on the storage capacitor equates to storing 300,000 electrons (Q=50 fC/$(1.6\times10^{-19})=30\times10^4$=300,000 electrons).

According to the teachings of the present invention, the floating gate transistors in the array are utilized not just as passive on or off switches as transfer devices in DRAM arrays but rather as active devices providing gain. In the present invention, to program the floating gate transistor "off," requires only a stored charge in the floating gate of about 100 electrons if the area is 0.1 $\mu$m by 0.1 $\mu$m. And, if the NOR flash memory cell is un-programmed, e.g. no stored charge trapped in the floating gate, and if the floating gate transistor is addressed over 10 nS a of current of 12.5 $\mu$A is provided. The integrated drain current then has a charge of 125 fC or 800,000 electrons. This is in comparison to the charge on a DRAM capacitor of 50 fC which is only about 300,000 electrons. Hence, the use of the floating gate transistors in the array as active devices with gain, rather than just switches, provides an amplification of the stored charge, in the floating gate, from 100 to 800,000 electrons over a read address period of 10 nS.

Figure 8:
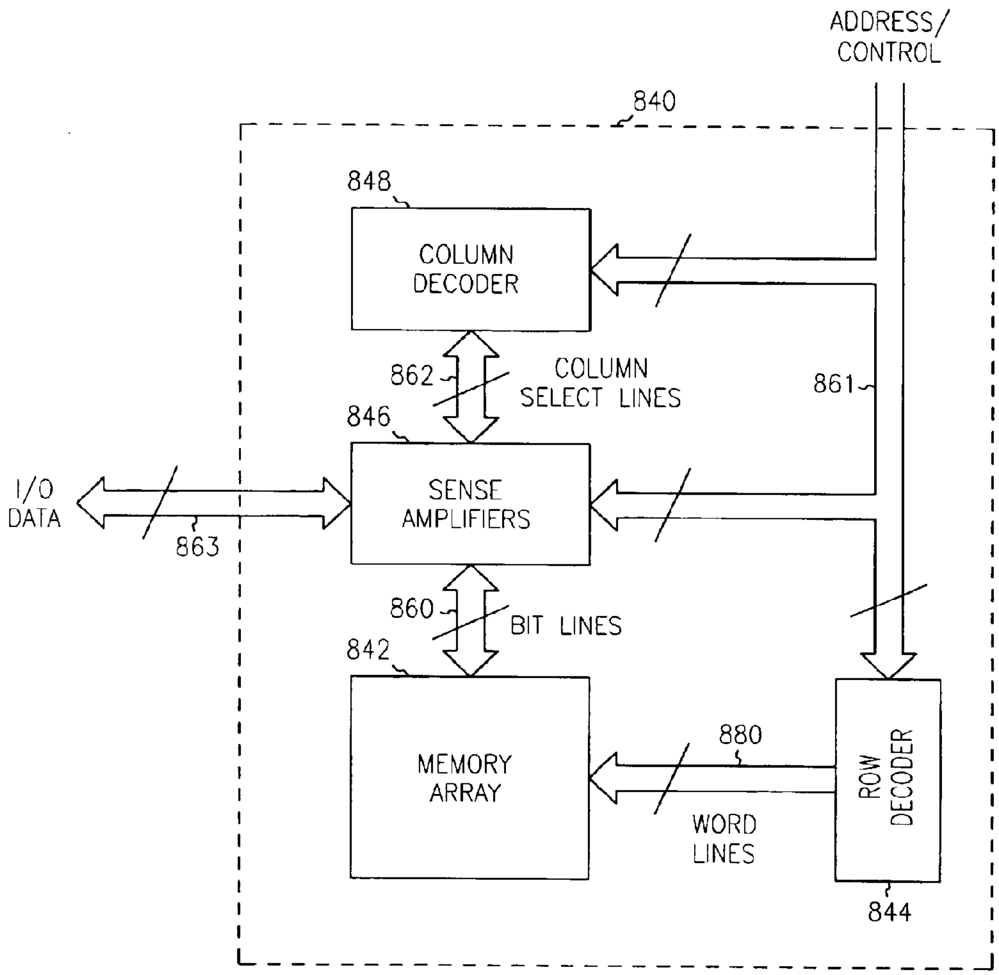
FIG. 8 illustrates a memory device according to the teachings of the present invention.

In FIG. 8 a memory device is illustrated according to the teachings of the present invention. The memory device 840 contains a memory array 842, row and column decoders 844, 848 and a sense amplifier circuit 846. The memory array 842 consists of a plurality of NOR flash memory cells 800, formed according to the teachings of the present invention whose word lines 880 and bit lines 860 are commonly arranged into rows and columns, respectively. The bit lines 860 of the memory array 842 are connected to the sense amplifier circuit 846, while its word lines 880 are connected to the row decoder 844. Address and control signals are input on address/control lines 861 into the memory device 840 and connected to the column decoder 848, sense amplifier circuit 846 and row decoder 844 and are used to gain read and write access, among other things, to the memory array 842.

The column decoder 848 is connected to the sense amplifier circuit 846 via control and column select signals on column select lines 862. The sense amplifier circuit 846 receives input data destined for the memory array 842 and outputs data read from the memory array 842 over input/output (I/O) data lines 863. Data is read from the cells of the memory array 842 by activating a word line 880 (via the row decoder 844), which couples all of the memory cells corresponding to that word line to respective bit lines 860, which define the columns of the array. One or more bit lines 860 are also activated. When a particular word line 880 and bit lines 860 are activated, the sense amplifier circuit 846 connected to a bit line column detects and amplifies the conduction sensed through a given NOR flash memory cell and transferred to its bit line 860 by measuring the potential difference between the activated bit line 860 and a reference line which may be an inactive bit line. Again, in the read operation the source region of a given cell is couple to a grounded array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 9:
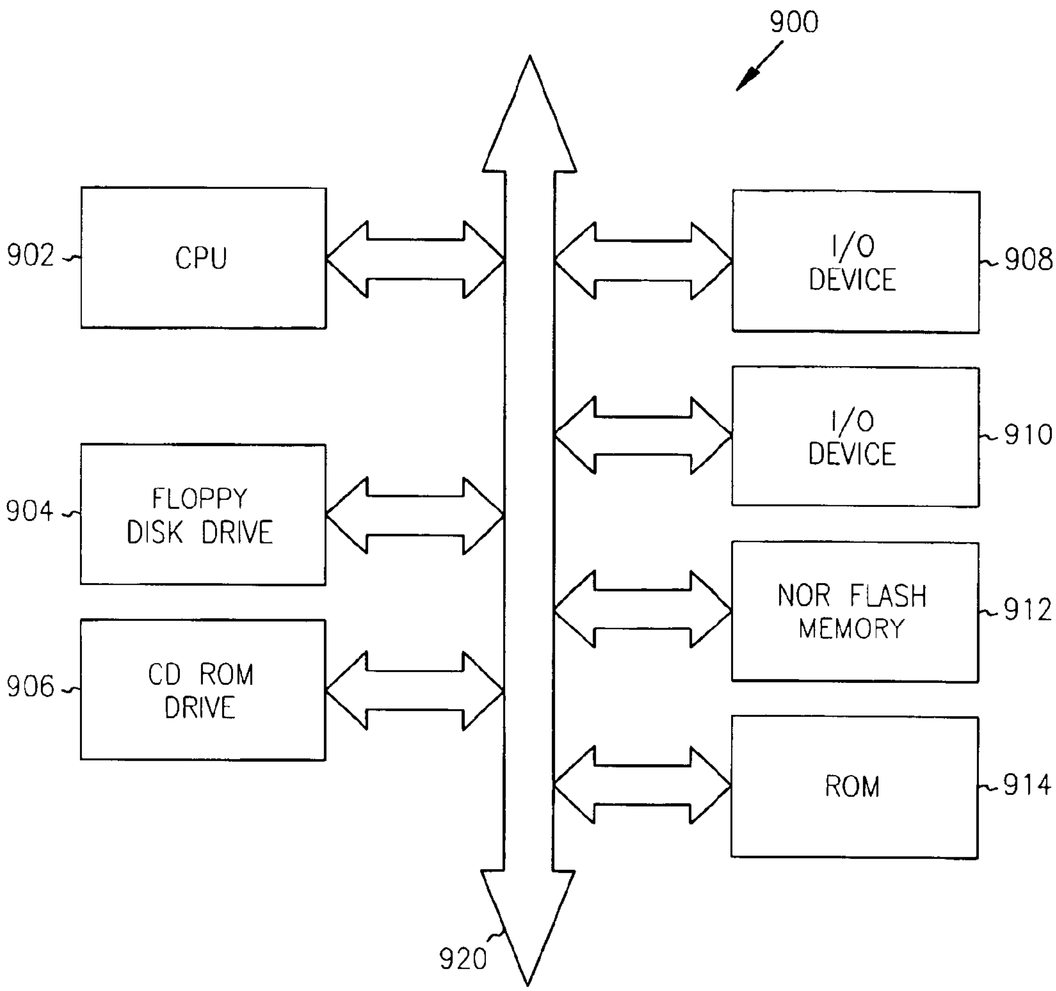
FIG. 9 is a block diagram of an electrical system, or processor-based system, utilizing memory constructed in accordance with the present invention.

FIG. 9 is a block diagram of an electrical system, or processor-based system, 900 utilizing NOR flash memory 912 constructed in accordance with the present invention. That is, the NOR flash memory 912 utilizes the modified NOR flash cell architecture as explained and described in detail in connection with FIGS. 2–6. The processor-based system 900 may be a computer system, a process control system or any other system employing a processor and associated memory. The system 900 includes a central processing unit (CPU) 902, e.g., a microprocessor, that communicates with the NOR flash memory 912 and an I/O device 908 over a bus 920. It must be noted that the bus 920 may be a series of buses and bridges commonly used in a processor-based system, but for convenience purposes only, the bus 920 has been illustrated as a single bus. A second I/O device 910 is illustrated, but is not necessary to practice the invention. The processor-based system 900 can also includes read-only memory (ROM) 914 and may include peripheral devices such as a floppy disk drive 904 and a compact disk (CD) ROM drive 906 that also communicates with the CPU 902 over the bus 920 as is well known in the art.

It will be appreciated by those skilled in the art that additional circuitry and control signals can be provided, and that the memory device 900 has been simplified to help focus on the invention. At least one of the NOR flash memory cell in NOR flash memory 912 includes a programmed flash cell.

It will be understood that the embodiment shown in FIG. 9 illustrates an embodiment for electronic system circuitry in which the novel memory cells of the present invention are used. The illustration of system 900, as shown in FIG. 9, is intended to provide a general understanding of one application for the structure and circuitry of the present invention, and is not intended to serve as a complete description of all the elements and features of an electronic system using the novel memory cell structures. Further, the invention is equally applicable to any size and type of memory device 900 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Two transistors occupy an area of 4 F squared when viewed from above, or each memory cell consisting of one transistor has an area of 2 F squared. NAND flash memories are ideally as small as 4 F squared in conventional planar device technology, with practical devices having a cell area of 5 F squared. The vertical NOR flash memory cells described here have a higher density than conventional planar NAND cells but they would operate at speeds higher than or comparable to conventional planar NOR flash memories. The NOR flash memories described here then have both high density and high speed.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A NOR flash memory cell, comprising:

a vertical floating gate transistor extending outwardly from a substrate, the floating gate transistor having a first source/drain region, a second source/drain region, a channel region between the first and the second source/drain regions, a floating gate separated from the channel region by a gate insulator, and a control gate separated from the floating gate by a gate dielectric;

a sourceline formed in a trench adjacent to the vertical floating gate transistor, wherein the first source/drain region is coupled to the sourceline;

a transmission line coupled to the second source/drain region; and wherein the floating gate transistor is a programmed floating gate transistor having a charge trapped in the floating gate such that the programmed floating gate transistor operates at reduced drain source current.

2. The NOR flash memory cell of claim 1, wherein the first source/drain region of the floating gate transistor includes a source region and the second source/drain region of the floating gate transistor includes a drain region.

3. The NOR flash memory cell of claim 1, wherein the transmission line includes a bit line.

4. The NOR flash memory cell of claim 1, wherein the gate insulator has a thickness of approximately 10 nanometers (nm).

5. A NOR flash memory cell, comprising:

a vertical floating gate transistor formed according to a modified DRAM fabrication process, the floating gate transistor having a source region, a drain region, a channel region between the source and the drain regions, a floating gate separated from the channel region by a gate insulator, and a control gate separated from the floating gate by a gate dielectric;

a wordline coupled to the control gate;

a sourceline formed in a trench adjacent to the vertical floating gate transistor, wherein the source region is coupled to the sourceline;

a bit line coupled to the drain region; and wherein the floating gate transistor is a programmed floating gate transistor having a charge trapped in the floating gate.

6. The NOR flash memory cell of claim 5, wherein the gate insulator has a thickness of at least 10 nanometers (nm).

7. A NOR memory array, comprising:

a number of NOR flash memory cells extending from a substrate and separated by trenches, wherein each flash memory cell includes a first source/drain region, a second source/drain region, a channel region between the first and the second source/drain regions, a floating gate separated from the channel by a first gate insulator, and a control gate separated from the floating gate by a second gate insulator;

a number of bit lines coupled to the second source/drain region of each flash memory cell along rows of the memory array;

a number of word lines coupled to the control gate of each flash memory cell along columns of the memory array;

a number of sourcelines along rows in the trenches between the number of flash memory cells extending from a substrate, wherein the first source/drain region of each flash memory cell is coupled to the number of sourcelines; and wherein at least one of the flash memory cells is a programmed cell having a charge trapped in the floating gate.

8. The memory array of claim 7, wherein each NOR flash memory cell includes a vertical NOR flash memory cell.

9. The memory array of claim 7, wherein the first gate insulator of each NOR flash memory cell has a thickness of approximately 10 nanometers (nm).

10. The memory array of claim 7, wherein the number of NOR flash memory cells extending from a substrate operate as equivalent to a transistor having a size of approximately 2.0 lithographic features squared (2 $F^2$).

11. A NOR memory array, comprising:

a number of vertical pillars formed in rows and columns extending outwardly from a substrate and separated by a number of trenches, wherein the number of vertical pillars serve as floating gate transistors including a first source/drain region, a second source/drain region, a channel region between the first and the second source/drain regions, a floating gate separated from the channel by a first gate insulator in the trenches along rows of pillars, and a control gate separated from the floating gate by a second gate insulator, wherein along columns of the pillars adjacent pillars include a floating gate transistor which operates as a programmed cell on one side of a trench and a floating gate transistor which operates as a reference cell having a programmed conductivity state on the opposite side of the trench;

a number of bit lines coupled to the second source/drain region of each transistor along rows of the memory array;

a number of word lines coupled to the control gate of each floating gate transistor along columns of the memory array;

a number of sourcelines formed in a bottom of the trenches between rows of the pillars and coupled to the first source/drain regions of each floating gate transistor along rows of pillars, wherein along columns of the pillars the first source/drain region of each transistor in column adjacent pillars couples to the sourceline in a shared trench.

12. The memory array of claim 11, wherein each floating gate is a vertical floating gate formed in a trench below a top surface of each pillar such that each trench houses a pair of floating gates on opposing sides of the trench opposing the channel regions in column adjacent pillars.

13. The memory array of claim 12, wherein the control gate is formed in the trench below the top surface of the pillars and between the pair of floating gates, wherein each pair of floating gates shares a single control gate, and wherein each floating gate includes a vertically oriented floating gate having a vertical length of less than 100 nanometers.

14. The memory array of claim 12, wherein the control gates are formed in the trench below the top surface of the pillars and between the pair of floating gates such that each trench houses a pair of control gates each addressing a floating gate on opposing sides of the trench respectively, and wherein the pair of control gates are separated by an insulator layer.

15. The memory array of claim 12, wherein the control gates are disposed vertically above the floating gates, and wherein each pair of floating gates shares a single control gate line.

16. The memory array of claim 12, wherein a pair of control gates are disposed vertically above the floating gates.

17. The memory array of claim 11, wherein each floating gate is a horizontally oriented floating gate formed in a trench below a top surface of each pillar such that each trench houses a floating gate opposing the channel regions in column adjacent pillars on opposing sides of the trench, and wherein each horizontally oriented floating gate has a vertical length of less than 100 nanometers opposing the channel regions of the pillars.

18. The memory array of claim 17, wherein the control gates are disposed vertically above the floating gates.

19. The memory array of claim 11, wherein the number of sourcelines formed in a bottom of the trenches between rows of the pillars include a doped region implanted in the bottom of the trench.

20. The memory array of claim 11, wherein the first gate insulator of each floating gate transistor has a thickness of approximately 10 nanometers (nm).

21. The memory array of claim 11, wherein each floating gate transistor operates as equivalent to a transistor having a size of approximately 2.0 lithographic features squared (2 $F^2$).

22. A memory device, comprising:

a NOR memory array, wherein the memory array includes a number of vertical NOR flash cells extending outwardly from a substrate and separated by trenches, wherein each NOR flash cell includes a source region, a drain region, a channel region between the source and the drain regions, a floating gate separated from the channel region by a first gate insulator, and a control gate separated from the floating gate by a second gate insulator;

a number of bitlines coupled to the drain region of each vertical NOR flash cell along rows of the memory array;

a number of wordlines coupled to the control gate of each vertical NOR flash cell along columns of the memory array;

a number of sourcelines, wherein the first source/drain region of each vertical NOR flash cell is integrally formed with the number of sourcelines along rows in the trenches between the number of vertical NOR flash cells extending from a substrate;

a wordline address decoder coupled to the number of wordlines;

a bitline address decoder coupled to the number of bitlines; and one or more sense amplifiers coupled to the number of bitlines.

23. The memory device of claim 22, wherein the first gate insulator of each NOR flash cell has a thickness of approximately 10 nanometers (nm).

24. The memory device of claim 23, wherein the wordline address decoder and the bitline address decoder each include conventionally fabricated MOSFET transistors having thin gate insulators formed of silicon dioxide ($SiO_2$).

25. The memory device of claim 23, wherein the one or more sense amplifiers include conventionally fabricated MOSFET transistors having thin gate insulators formed of silicon dioxide ($SiO_2$).

26. An electronic system, comprising:

a processor; and a memory device coupled to the processor, wherein the memory device includes a NOR memory array, the NOR memory array including;

a number of vertical pillars formed in rows and columns extending outwardly from a substrate and separated by a number of trenches, wherein each vertical pillar comprises a pair of floating gate transistors on opposing sides of each pillar, including a first source/drain region, a second source/drain region, a channel region between the first and the second source/drain regions, a floating gate separated from the channel region by a first gate insulator in the trenches along rows of pillars, and a control gate separated from the floating gate by a second gate insulator, wherein along columns of the pillars the trench between column adjacent pillars include a pair of floating gates each one opposing the channel regions of the pillar on a respective side of the trench;

a number of bit lines coupled to the second source/drain region of each floating gate transistor along rows of the memory array;

a number of word lines coupled to the control gate of each floating gate transistor along columns of the memory array;

a number of sourcelines formed in a bottom of the trenches between rows of the pillars and coupled to the first source/drain regions of each floating gate transistor along rows of pillars, wherein along rows of the pillars the first source/drain region of each floating gate transistor in column adjacent pillars couples to the sourceline in a shared trench such that each floating gate transistor neighboring the shared trench shares a common sourceline; and wherein at least one of floating gate transistors is a programmed flash cell.

27. The electronic system of claim 26, wherein the programmed flash cell includes a charge of approximately 100 electrons trapped on the floating gate of the programmed flash cell.

28. The electronic system of claim 26, wherein each floating gate transistor operates as equivalent to a floating gate transistor having a size equal to or less than 2.0 lithographic features squared (2 $F^2$).

29. The electronic system of claim 26, wherein, in a read operation, a sourceline for two column adjacent pillars sharing a trench is coupled to a ground potential, the drain regions of the column adjacent pillars sharing a trench are precharged to a fractional voltage of VDD, and the control gate for each of the column adjacent pillars sharing a trench is addressed such that a conductivity state of a floating gate transistor in the NOR memory array can be sensed.

30. The electronic system of claim 26, wherein, in a write operation, a sourceline for two column adjacent pillars sharing a trench is biased to a voltage higher than VDD, one of the drain regions of the column adjacent pillars sharing a trench is coupled to a ground potential, and the control gate for each of the column adjacent pillars sharing a trench is addressed with a wordline potential.

* * * * *

UNITED STATES PATENT AND TRADEMARK OFFICE

CERTIFICATE OF CORRECTION

PATENT NO. : 6,996,009 B2
APPLICATION NO. : 10/177483
DATED : February 7, 2006
INVENTOR(S) : Forbes It is certified that error appears in the above-identified patent and that said Letters Patent is hereby corrected as shown below:

On the face page, in field (56), under “Foreign Patent Documents”, in column 1, line 1, after “10/1991” insert - - H01L 29/784 - -.

On the face page, in fieled (56), under “Foreign Patent Documents”, in column 1, line 2, after “8/1994” insert - - H01L 29/784 - -.

On the face page, in field (56), under “Foreign Patent Documents”, in column 1, line 3, after “10/1994” insert - - H01L 29/788 - -.

On the face page, in field (56), under “Foreign Patent Documents”, in column 1, line 4, after “10/1996” insert - - H01L 27/10 - -.

On the face page, in field (56), under “Other Publications”, in column 2, line 2, delete “deposition” and insert - - deposition - -, therefor.

On the face page, in field (56), under “Other Publications”, in column 2, line 7, delete “Meeting,,” and insert - - Meeting, - -, therefor.

On page 3, in field (56), under “Other Publications”, in column 1, line 42, delete “Mecrocrystalline” and insert - - Microcrystalline - -, therefor.

On page 3, in field (56), under “Other Publications”, in column 1, line 49, delete ““Tunnelling” and insert - - Tunneling - -, therefor.

On page 3, in field (56), under “Other Publications”, in column 2, lines 1-3, below “Goodwin,……(Feb. 2002).” insert - - Guha, S, et al., “Atomic beam deposition of lanthanum-and yttrium -based oxide thin films for gate dielectrics”, Appl. Phys. Lett., 77, (2000), 2710-2712. - -.

On page 3, in field (56), under “Other Publications”, in column 2, line 44, delete “22 (11).” and insert - - 22(11), - -, therefor.

On page 4, in field (56), under “Other Publications”, in column 1, lines 34-35, delete “Charcteristics” and insert - - Characteristics - -, therefor.

On page 4, in field (56), under “Other Publications”, in column 1, line 47, delete “(Dec.,” and insert - - (Dec. - -, therefor.

UNITED STATES PATENT AND TRADEMARK OFFICE

CERTIFICATE OF CORRECTION

PATENT NO. : 6,996,009 B2
APPLICATION NO. : 10/177483
DATED : February 7, 2006
INVENTOR(S) : Forbes It is certified that error appears in the above-identified patent and that said Letters Patent is hereby corrected as shown below:

On page 4, in field (56), under "Other Publications", in column 1, lines 46-48, below "Renlund,…...2716-2722." insert - - Renlund, G.M., "Silicon oxycarbide glasses: Part II. Structure and properties", J. Mater, Res., vol. 6, No. 12, (Dec. 1991), pp. 2723-2724. - -.

On page 4, in field (56), under "Other Publications", in column 2, line 8, delete ""Fabriation" and insert - - "Fabrication - -, therefor.

On page 4, in field (56), under "Other Publications", in column 2, line 21, delete "479-480." and insert - - 479-480. - -, therefor.

On page 4, in field (56), under "Other Publications", in column 2, line 27, after "White, M H.," insert - - et al., - -.

On page 4, in field (56), under "Other Publications", in column 2, line 31, delete "Programmme" and insert - - Programme - -, therefor.

On page 4, line field (56), under "Other Publications", in column 2, line 42, delete "1633-1636." and insert - - 633-636. - -, therefor.

On page 4, in field (56), under "Other Publications", in column 2, line 49, delete "Zhu." and insert - - Zhu, - -, therefor.

In column 1, line 33, delete "e.g" and insert - - e.g., - -, therefor.

In column 2, line 11, delete "103-106);" and insert - - 103-106; - -, therefor.

In column 5, line 26, delete "applications," and insert - - application, - -, therefor.

In column 7, line 45, delete "devices" and insert - - devices, - -, therefor.

In column 7, line 47, delete "devices" and insert - - devices, - -, therefor.

In column 10, line 52, delete "copending" and insert - - co-pending - -, therefor.

In column 11, line 22, delete "electron/$cm^2$" and insert - - electrons/$cm^2$ - -, therefor.

UNITED STATES PATENT AND TRADEMARK OFFICE

CERTIFICATE OF CORRECTION

PATENT NO. : 6,996,009 B2
APPLICATION NO. : 10/177483
DATED : February 7, 2006
INVENTOR(S) : Forbes It is certified that error appears in the above-identified patent and that said Letters Patent is hereby corrected as shown below:

In column 12, line 10, delete “a of” and insert - - of a - -, therefor.

Signed and Sealed this

Twenty-second Day of August, 2006

JON W. DUDAS

*Director of the United States Patent and Trademark Office*